United States Patent [19]

Napoli

[11] 3,987,214

[45] Oct. 19, 1976

[54] METHOD OF FORMING CONDUCTIVE COATINGS OF PREDETERMINED THICKNESS BY VACUUM DEPOSITING CONDUCTIVE COATING ON A MEASURING BODY

[75] Inventor: Louis Sebastian Napoli, Princeton, N.J.

[73] Assignee: RCA Corporation, New York, N.Y.

[22] Filed: Sept. 19, 1975

[21] Appl. No.: 614,858

[52] U.S. Cl. .................. 427/10; 427/9; 427/58; 427/124; 427/250; 118/9
[51] Int. Cl.² ........................ C23C 13/02
[58] Field of Search ......... 427/9, 10, 58, 124, 427/250; 118/9

[56] References Cited
UNITED STATES PATENTS

| | | |
|---|---|---|
| 3,374,112 | 3/1968 | Danon .................. 427/10 |
| 3,383,238 | 5/1968 | Unzicker et al. .......... 427/10 |
| 3,620,814 | 11/1971 | Clark et al. ............. 427/10 |
| 3,699,916 | 10/1972 | Sheahan et al. .......... 427/10 |
| 3,765,940 | 10/1973 | Hentzschel ............. 427/10 |

Primary Examiner—Ralph S. Kendall
Assistant Examiner—John D. Smith
Attorney, Agent, or Firm—Glenn H. Bruestle; Carl L. Silverman

[57] ABSTRACT

A substrate to be coated and a measuring body are simultaneously coated with a conductive coating. The measuring body includes two surfaces separated by insulating material and transversely spaced a predetermined distance. One surface extends over the other surface. The surfaces defining the predetermined distance are each metallized and provided with electrical connections. The deposition is terminated when the conductive coating fills the predetermined distance between the surfaces.

9 Claims, 3 Drawing Figures

3,987,214

METHOD OF FORMING CONDUCTIVE COATINGS OF PREDETERMINED THICKNESS BY VACUUM DEPOSITING CONDUCTIVE COATING ON A MEASURING BODY

BACKGROUND OF THE INVENTION

This invention relates to a method for accurately depositing a conductive coating of predetermined thickness on a substrate, and particularly to such a method wherein the simultaneous deposition of a conductive coating of the predetermined thickness on a substrate and on a measuring body causes an abrupt change in resistance of the measuring body which is utilized to terminate the deposition.

It is often necessary to deposit a conductive coating of an accurately predetermined thickness on a substrate, as by deposition under vacuum, with such deposition being reproducible with a high degree of accuracy. Heretofore, various methods have been employed to control the thickness of a coating deposited on a substrate. Most of the methods include determining the added mass or weight on the substrate and then calculating the thickness, e.g., weighing the substrate before and after the deposition or employing a pair of quartz crystals and determining the added mass from the change in resonant frequency. Another method utilizes two spaced apart conductive regions each of which is connected to a resistance measuring device. As the deposition of the conductor proceeds, the space is gradually filled with conductive material causing the resistance to decrease proportionally to the thickness of the coating and the particular conductive material employed.

Although available methods are suitable for most situations, present methods generally involve lengthy calculations as the thickness of the coating is measured indirectly. Furthermore, the indirect measurement of thickness increases the likelihood of error while decreasing the accuracy obtainable. In addition, present methods often require the use of costly equipment and continuous monitoring so as to be unacceptable to many users.

SUMMARY OF THE INVENTION

A conductive coating of predetermined thickness is formed on a substrate by simultaneously depositing a conductive coating on a substrate and on a measuring body. The measuring body has a pair of surfaces which are separated by insulating material. The surfaces of the measuring body are transversely separated a predetermined distance with one surface extending over a portion of the other surface in cantilever fashion. The deposition is terminated when the conductive coating is of the predetermined thickness so that the coating on one surface of the measuring body contacts the coating on the other surface of the measuring body.

DETAILED DESCRIPTION OF THE INVENTION

Figure 1:
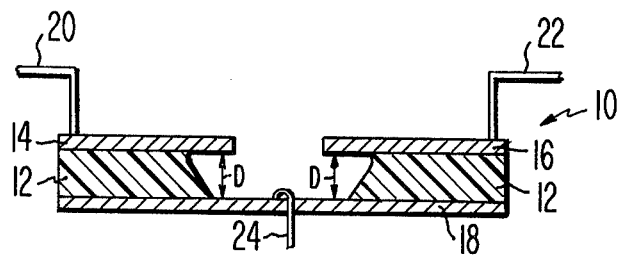
FIG. 1 is a sectional view of one form of a measuring body employed in the method of the present invention.

Referring initially to FIG. 1, one form of a measuring body employed in the method of the present invention is generally designated as 10. The measuring body 10 includes a pair of spaced coplanar metal layers 14 and 16. A third metal layer 18 is transversely spaced a predetermined distance D from the coplanar metal layers 14 and 16. Each of the metal layers 14, 16 and 18 have top and bottom surfaces. The metal layers 14 and 18, and 16 and 18 are separated by a body 12 of insulating material, such as aluminum oxide. The coplanar metal layers 14 and 16 are separated by a gap therebetween. The coplanar layers 14 and 16 each extend over a portion of the metal layer 18 so as to be cantilevered over the metal layer 18. Terminals 20, 22, and 24 are provided for electrically connecting to the metal layers 14, 16 and 18.

To carry out the method of the present invention, the measuring body 10, having the predetermined distance D between metal layers 14 and 18, and 16 and 18, and a substrate are simultaneously coated with a conductive material. For example, in an evaporation chamber, the substrate to be coated and the measuring body 10 would be placed in close proximity and in substantially the same orientation in order to insure that the coating thickness grows substantially the same on both the substrate and on the measuring body 10. During the deposition of a conductive material, such as copper, the conductive coating will simultaneously be deposited on the top surfaces of the metal layers 14, 16, and 18 of the measuring body 10, as well as on the surface of the substrate.

Eventually, the conductive coating deposited on the top surface of the metal layer 18 of the measuring body 10 will make electrical contact with the bottom surface of the coplanar metal layers 14 and 16 so as to short circuit the metal layers 14 and 18, 16 and 18, and 14 and 16. Since the distance between the coplanar layers 14 and 16, and the transversely spaced layer 18 is predetermined, the substrate has at this point also been coated with a coating of the predetermined thickness. The deposition is terminated at this point by employing the short circuit achieved between any pair of the terminals 20 and 24, 22 and 24, or even 20 and 22. For example, a relay can be connected between any two appropriate terminals wherein the short circuit will cause the relay to shutter the source of conductive material, or turn off the current, thereby terminating the deposition at the predetermined coating thickness.

The measuring body 10 of FIG. 1 can be fabricated by first constructing a structure having an insulating layer of the predetermined thickness sandwiched between a pair of metal layers. It may be necessary, in some cases, to provide a metal layer which is sufficiently thick enough to extend over a large portion of the recess without collapsing. For example, an aluminum oxide layer of predetermined thickness can be deposited on a metal layer, such as gold or aluminum, and then a second metal layer deposited thereon by techniques well known in the art. The structure can be then modified into the measuring body 10, as in FIG. 1, by applying photoresist on the surface areas of the structure that are to become the coplanar layers 14 and 16 employing well known photolithographic techniques. The uncovered portion of the second metal layer is etched away using a suitable etchant for the particular metal employed. The oxide remaining between the coplanar layers 14 and 16 is then removed by etching the exposed portion of the oxide with a suitable etchant while using the remaining coplanar metal layers 14 and 16 as an etching mask. During this etching operation, the oxide layer will not only be etched perpendicularly to the coplanar metal layers 14 and 16, but also slightly under the coplanar layers 14 and 16, leaving the edges of the coplanar metal layers 14 and 16 overhanging the recess formed, as in FIG. 1. The etching of the oxide continues until the bottom metal layer is reached. The electrical terminals 20, 22 and 24 can be attached to the metal layers 14, 15 and 18 by techniques well known in the art so as to produce the structure shown in FIG. 1.

Figure 2:
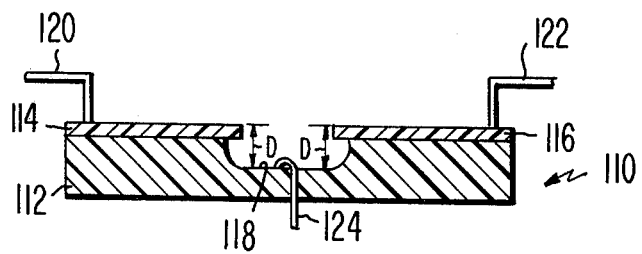
FIG. 2 is a sectional view of another form of a measuring body employed in the method of the present invention.

The measuring body 110 of FIG. 2 can also be successfully employed in the method of the present invention. The measuring body 110 includes a pair of spaced coplanar non-metal layers 114 and 116 disposed on a body 112 of insulating material. A surface 118 of the body 112 of insulating material is transversely spaced a predetermined distance from the coplanar layers 114 and 116. Since the coplanar layers 114 and 116 and the transversely spaced surface 118 are nonconductive, electrical contact, in this case, will occur when the conductive coating deposited on the surface 118 contacts the conductive coating deposited on the top surfaces of the coplanar layers 114 and 116.

The measuring body 110 can be constructed by coating a body 112 of insulating material, such as insulating gallium arsenide, with a non-metal layer, such as silicon dioxide. Photoresist is then applied on the surface areas the non-metal layers that are to become the coplanar non-metal layers 114 and 116 employing well known photolithographic techniques. The uncovered portion of the non-metal layer is etched away using a suitable etchant. The exposed insulating material between the coplanar layers 114 and 116 is then etched using a suitable etchant while the remaining coplanar layers 114 and 116 are used as an etching mask. The etching continues until the distance between the surface 118 and the top surfaces of the coplanar layers 114 and 116 reaches the predetermined distance D. Terminals 120, 122, and 124 can be attached to the coplanar layers 114 and 116 as well as to the surface 118 by techniques well known in the art.

Figure 3:
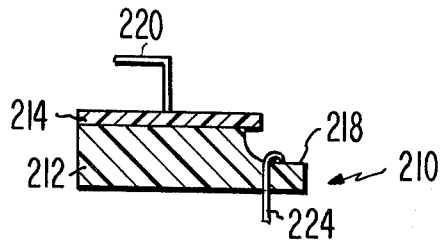
FIG. 3 is a sectional view of still another form of a measuring body employed in the method of the present invention.

Although the method of the present invention has been described using a measuring body having three surfaces, the method is equally successful when two surfaces are utilized, i.e., a measuring body 210, as shown in FIG. 3. The measuring body 210 of FIG. 3 can be formed by halving the measuring body 10 of FIG. 1 or the measuring body 110 of FIG. 2. Thus, the method of the present invention permits the forming of conductive coatings of predetermined thickness on a substrate wherein no lengthy calculations nor costly equipment is necessary. Furthermore, the method of the present invention does not require continuous monitoring.

I claim:
1. A method of forming a conductive coating of predetermined thickness on a substrate, comprising the steps of:
   simultaneously vacuum depositing a conductive coating on said substrate and on a measuring body, said measuring body having a first and second surfaces separated by insulating material with said first and second surfaces being transversely spaced the predetermined distance and with said first surface extending over a portion of said second surface so as to be cantilevered over said second surface, and
   terminating said deposition when said conductive coating is of said predetermined thickness wherein said coating on said second surface of said measuring body contacts said coating on said first surface.
2. A method in accordance with claim 1 in which prior to said deposition, said substrate and said measuring body are placed in a deposition chamber in close proximity and in substantially the same orientation.
3. A method in accordance with claim 1 in which said first and second surfaces of said measuring body are each on a metal layer.
4. A method in accordance with claim 3 in which each of said surfaces of said measuring body has a terminal electrically connected thereto.
5. A method in accordance with claim 1 in which said measuring body includes a third surface which is coplanar with said first surface and spaced from said first surface so as to be cantilevered over said second surface.
6. A method in accordance with claim 5 in which said deposition is terminated when said conductive coating is of said predetermined thickness wherein said coating on said second surface of said measuring body contacts said coating on each of said first and said third surfaces.
7. A method in accordance with claim 6 in which prior to said deposition, said substrate and said measuring body are placed in close proximity and in substantially the same orientation in a deposition chamber.
8. A method in accordance with claim 6 in which said first and said third surfaces of said measuring body are each on a metal layer.
9. A method in accordance with claim 8 in which each of said surfaces of said measuring body has a terminal electrically connected thereto.

* * * * *